United States Patent [19]

Hollemann et al.

[11] Patent Number: 5,877,898
[45] Date of Patent: Mar. 2, 1999

[54] ARRANGEMENT FOR COMBINING AND SHAPING THE RADIATION OF A PLURALITY OF LASER DIODE LINES

[75] Inventors: Guenter Hollemann, Jena; Hermann Voelckel, Kahla, both of Germany; Michail Michailović Chaleev, St. Petersburg, Russian Federation; Arthur Afanasević Mak, St. Petersburg, Russian Federation; Vladimir Ivanović Ustyugov, St. Petersburg, Russian Federation; Aleksej Vadimović Michailov, St. Petersburg, Russian Federation; Georgij Egorović Novikov, St. Petersburg, Russian Federation; Oleg Aleksandrović Orlov, St. Petersburg, Russian Federation

[73] Assignee: Jenoptik Aktiengescellschaft, Jena, Germany

[21] Appl. No.: 849,577

[22] PCT Filed: Sep. 20, 1996

[86] PCT No.: PCT/EP96/04127

§ 371 Date: Jun. 3, 1997

§ 102(e) Date: Jun. 3, 1997

[87] PCT Pub. No.: WO97/14073

PCT Pub. Date: Apr. 17, 1997

[30] Foreign Application Priority Data

Oct. 6, 1995 [DE] Germany .......................... 195 37 265.4

[51] Int. Cl.⁶ ................................................... G02B 27/10
[52] U.S. Cl. ............................................................. 359/619
[58] Field of Search ................................... 359/618, 619, 359/641; 356/351

[56] References Cited

U.S. PATENT DOCUMENTS 4,961,079 10/1990 Owens et al. ............................ 346/108
4,978,197 12/1990 Horikawa ................................. 359/629
5,128,919 7/1992 Narahara et al. .......................... 369/97
5,210,643 5/1993 Fujii et al. ................................ 359/638
5,333,077 7/1994 Legar et al. ............................... 359/69
5,379,310 1/1995 Papen et al. .............................. 372/23
5,515,394 5/1996 Zhang ....................................... 372/72
5,694,180 12/1997 Deter et al. ............................. 348/746

OTHER PUBLICATIONS

Optics Letters, Jan. 15, 1995—Article "Stripe For Use With Laser Diode Bars" R.P. Edwin (pp. 222–224).

Optics Letters, Apr. 15, 1995—Article "Collimation of Emissions From a High–Power Multistrip Laser–Diode Bar With Multiprism Array Coupling and Focusing to a Small Spot" S. Yamagichi (pp. 898–890).

Conference on Lasers and Electro–Optics (Cleo) May 8–13, 1994, Anaheim, CA Novel Beam Shaping Technique for High Power Diode Bars: W.A. Clark, et al (p. 360).

*Primary Examiner*—Georgia Y. Epps
*Assistant Examiner*—Ricky Mack
*Attorney, Agent, or Firm*—McAulay Fisher Nissen Goldberg & Kiel, LLP

[57] ABSTRACT

The arrangement for combining and shaping the radiation of a plurality of laser diode lines, comprising at least two laser diode lines whose radiation has a cross section in the emission plane (x-y plane) whose longitudinal axis is a multiple of the transverse axis, one collimator unit for each laser diode line, which collimator unit is arranged downstream thereof in the radiation directly, a combining unit for combining the collimated radiation of the individual laser diode lines by a side-by-side arrangement in the direction of the transverse axis, and a recombining unit for dividing the combined radiation in the direction of the longitudinal axes into individual partial beams and recombining the latter by a side-by-side arrangement in the direction of the transverse axes.

11 Claims, 4 Drawing Sheets

ARRANGEMENT FOR COMBINING AND SHAPING THE RADIATION OF A PLURALITY OF LASER DIODE LINES

BACKGROUND OF THE INVENTION a) Field of the Invention

The invention is directed to an arrangement by means of which the radiation of a plurality of laser diode lines is combined and shaped in order, for example, to couple into an optical fiber or into the end face of a solid-state laser rod. This is a laser diode line light source which can be advantageously used, for example, in laser surgery, laser material processing or for pumping solid-state lasers.

b) Description of the Related Art

Laser diodes are distinguished from other lasers particularly by their high efficiency which is, however, combined with high current densities that allow only very small dimensions and accordingly limited output power.

Therefore, in many cases of application in which a higher laser output is needed, it becomes necessary to use the radiation output of a plurality of laser diodes which are combined in a corresponding manner.

High radiation quality, which is determined by the dimensioning of the beam cross section and the far-field divergence of the radiation, is required particularly when the combined beam bundle is to be coupled into a device or optical element following downstream.

The cross section of the emission surface of approximately 1 $\mu$m×100 $\mu$m in laser diodes results in an asymmetrical cross section for the respective emitting beam bundle with a longitudinal axis of approximately one hundred times the length of the transverse axis. This asymmetry is multiplied in the case of the radiation of a laser diode line due to the arrangement of individual emission surfaces on a straight line along their longitudinal axes as is required for technological reasons and reasons relating to cooling technique. In addition to the resulting unfavorable beam geometry, there is the widely different divergence of the radiation in the longitudinal axis and transverse axis. As is well known, the divergence of the laser diode radiation in the direction of the transverse axis, perpendicular to the plane of the pn junction of the laser diode, is as much as 90°, whereas it amounts to only approximately 10° in the direction of the longitudinal axis, that is, parallel to the plane of the pn junction. The highly asymmetrical beam geometry and the divergence of the beam bundle of a laser diode line results in exacting requirements for an arrangement for combining and shaping radiation that must ultimately generate a beam bundle adapted to the aperture of the optics following downstream in order to achieve high in-coupling efficiency.

OBJECT OF THE INVENTION

The primary object of the invention is to provide a novel arrangement by which the radiation of a plurality of laser diode lines is so combined and shaped that the combined beam bundle has the smallest possible cross section with the least possible asymmetry and far-field divergence.

This object is met in an arrangement in accordance with the invention, an arrangement for combining and shaping the radiation of a plurality of laser diode lines comprising at least two laser diode lines whose radiation has a cross section in the emission plane (x-y plane) whose longitudinal axis is a multiple of the transverse axis, a collimator unit of each laser diode line in the radiation direction, a combining unit for combining the collimated radiation of the individual laser diode lines by means of a side-by-side arrangement in the direction of the transverse axis, and a recombining unit for dividing the combined radiation in the direction of the longitudinal axes into individual partial beams and recombining the latter by means of a side-by-side arrangement in the direction of the transverse axes.

The invention is based essentially on the selection and sequence of the arrangement of optically active means for shaping, deflecting, dividing and combining the radiation from a plurality of laser diode lines to form a beam bundle. For this purpose, it is critical that the following means be arranged downstream of the laser diode lines in the following sequence in the direction of radiation:

1. Means for collimating the radiation of the laser diode lines (collimator unit);
2. Means for combining the collimated beams by means of a side-by-side arrangement in the direction of the transverse axis of the beams (combining unit);
3. Means for dividing the combined radiation in the direction of the longitudinal axis of the radiation and means for deflecting the partial beam bundles in order to recombine these partial beam bundles in a side-by-side arrangement in the direction of the transverse axis (recombining unit).

As will be explained more precisely hereinafter with reference to embodiment examples, the recombining unit can be embodied, for instance, by an integrated optical element or an arrangement of individual optical elements forming one or more modules. The beam splitting within an integrated optical element or within a module can be effected by reflection at plane surfaces with an identical angular position which are offset relative to one another in the radiating direction (first embodiment example) or by reflection at plane surfaces of different angular positions relative to the radiation direction (second embodiment example). The deflection and recombination of the radiation is effected by a 90-degree reflection of each partial beam bundle in two planes at right angles to one another so that the partial beam bundles are rotated and recombined in a side-by-side arrangement.

If the generated beam bundle is to be coupled into a downstream optical element, for example, the arrangement is supplemented by collecting optics as means for coupling in.

The invention is explained more fully in the following with reference to two embodiment examples shown in the drawing.

DESCRIPTION OF THE PERFERRED EMBODIMENT

Figure 1:
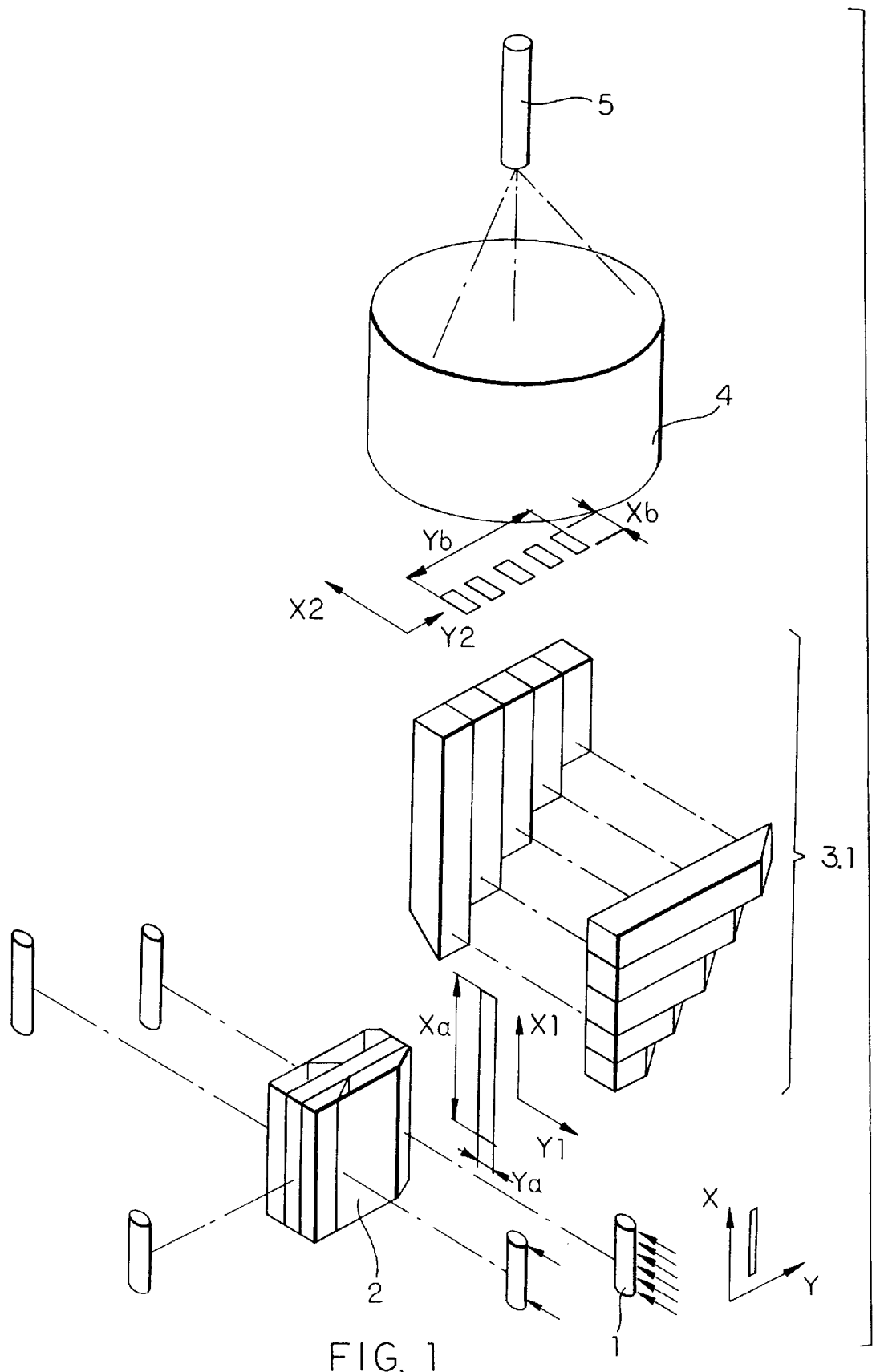
FIG. 1 is a schematic view of a first embodiment example of the invention with an integrated optical element 3.1 as recombining unit 3.
Figure 2A:
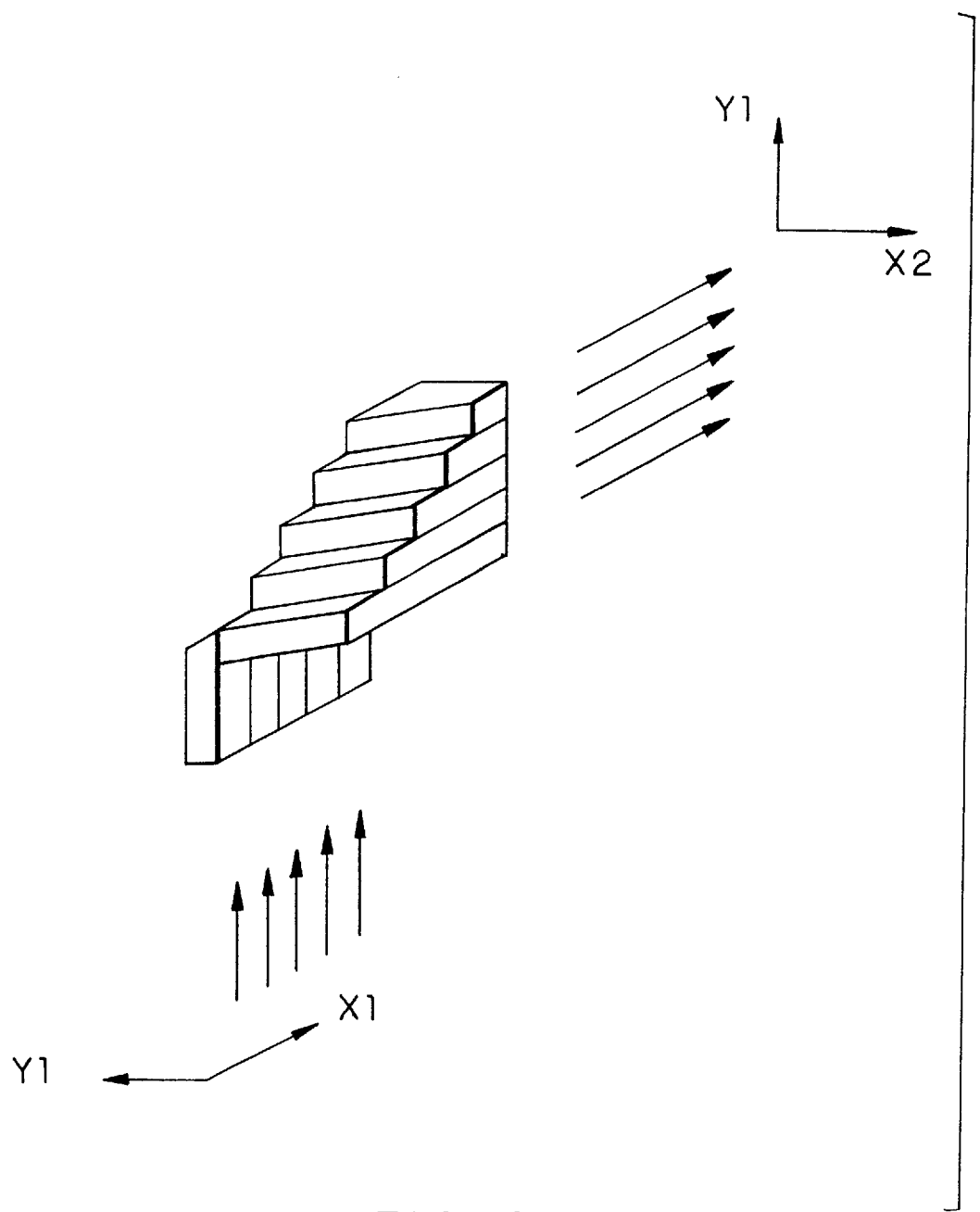
FIGS. 2a–d show the integrated optical element of the embodiment example shown in FIG. 1 from three sides in perspective.
Figure 2B:
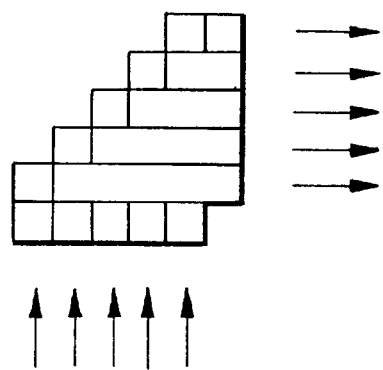
Figure 2C:
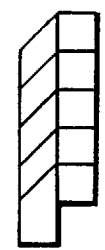
Figure 2D:
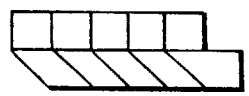

The embodiment examples shown in FIG. 1 of an arrangement, according to the invention, for combining and shaping the radiation of a plurality of laser diode lines comprises five laser diode lines which are not shown in the drawing for the sake of simplicity, five collimating units 1, a combining unit 2, an integrated optical element 3.1 as recombining unit 3, and collecting optics 4.

In order to better illustrate the change in beam geometry, a Cartesian x, y coordinate system is introduced and shown in transformation at different locations in the optical beam path. Its two coordinates are defined by the position of one of the laser diode lines.

As was already mentioned above, the laser diode lines are those in which the emission surfaces are arranged on a straight line in a plane with their longitudinal axes. The orientation of the longitudinal axes defines the x-axis and the orientation of the transverse axes defines the y-axis in the coordinate system. In the x-y plane, identical to the plane of the emission surfaces of the laser diode line, the beam geometry is determined by the arrangement of the emission surfaces and accordingly presents a stripe, e.g., with dimensions of approximately 1 μm×10 mm. In the drawing, neither this proportion nor the dimension ratios of the beam cross sections can be maintained in the individual transformation planes of the coordinate system.

For each of the five laser diode lines, one collimating unit 1 is arranged directly downstream thereof. Each collimating unit 1 is formed by an individual cylindrical lens 6 which collimates the radiation in the y-direction. To obtain an even higher beam quality, the collimating unit can additionally comprise a cylindrical lens line which collimates the radiation in the x-direction. The individual cylindrical lens 6 as well as the lenses of the cylindrical lens line, if any, can advantageously have an aspherical profile to eliminate spherical aberrations.

Of course, the collimating unit 1 can also be formed by other optical elements effecting a collimation of the radiation in the y-direction or in the x- and y-directions, e.g., gradient index lenses.

All collimating arrangements 1 share the common feature that they are arranged downstream of the combining unit 2 which combines the collimated radiation of the individual laser diode lines. This combining unit 2 is formed of a determined quantity of transparent plates with reflective facets whose quantity and arrangement is determined by the quantity and arrangement of the laser diode lines. In the embodiment example, in which four of the five laser diode lines are arranged in parallel planes and emit radiation in opposite directions in pairs, while the fifth laser diode line is directed at a right angle thereto, the combining unit 2 which is constructed in the present case as an integrated optical element comprises three plates. While the middle plate allows the collimated radiation of a laser diode line to pass through without being influenced, the collimated radiation of the other laser diode lines is deflected by 90° at reflection surfaces located in the two outer plates. Of course, the combining unit 2 can also be formed of individual optical elements with correspondingly arranged reflection surfaces. The beam bundle formed by the combining unit 2 already has a slightly more favorable beam geometry in the transformed $x_1$, $y_1$ coordinate system than the radiation in the plane of the x, y coordinate system due to the side-by-side arrangement in the transverse direction. While the dimension or extent of the beam bundle cross section in the x-direction remains constant, its dimension in the y-direction is slightly greater so that the asymmetry of the common beam bundle of all laser diode lines is less than that of the radiation of an individual laser diode line. This improvement ultimately results in a higher, more homogeneously distributed radiation energy along the beam cross section when coupling into optics arranged downstream.

The decisive improvement in the geometry of the beam bundle is achieved by means of the integrated optical element 3.1 following the combining unit 2. This integrated optical element 3.1 brings about the beam geometry shown in the transformed $x_2$, $y_2$ coordinate system.

The integrated optical element 3.1 is formed of an even number of rectangular rods, each with a 45-degree facet. The rectangular rods are so dimensioned and arranged in the form of two interconnected stacks that the beam entry surfaces of the first stack in the radiating direction and the beam exit surfaces of the second stack in the radiation direction lie in each instance on a straight line in two planes perpendicular to one another. Within a stack, the length of the rectangular rods decreases linearly. The two stacks are so arranged relative to one another that two rectangular rods form a pair of rods, each with the same optical path, and act as waveguides for each partial beam bundle. The integrated optical element 3.1 can also be fabricated from a part with the same optical function surfaces as those described.

An integrated optical element 3.1 with five rods per stack, as is shown in FIG. 1 and more precisely in FIGS. 2a–d, accordingly divides the impinging beam bundle with the length dimensions of $x_a$ and $y_a$, as designated in the $x_1$, $y_1$ coordinate system, into five partial bundles and deflects these partial bundles via a twofold reflection in each instance at the 45-degree facets so that after exiting from the integrated optical element 3.1 they form a beam bundle with length dimensions $xb=x_a/5$ and $y_b$, where $y_b$ is determined by the length difference between the respective outer rectangular rods of a stack. By means of optimizing the quantity of rectangular rods and their length difference, the difference in the axial lengths of the beam bundles in the $x_2$-direction and $y_2$-direction can be not only minimized, but completely eliminated so as to result in a beam bundle which is virtually symmetrical to the optical axis.

Collecting optics 4 which couple the beam bundle into a downstream optical fiber 5 are advantageously arranged downstream of the integrated optical element 3.1.

Figure 3:
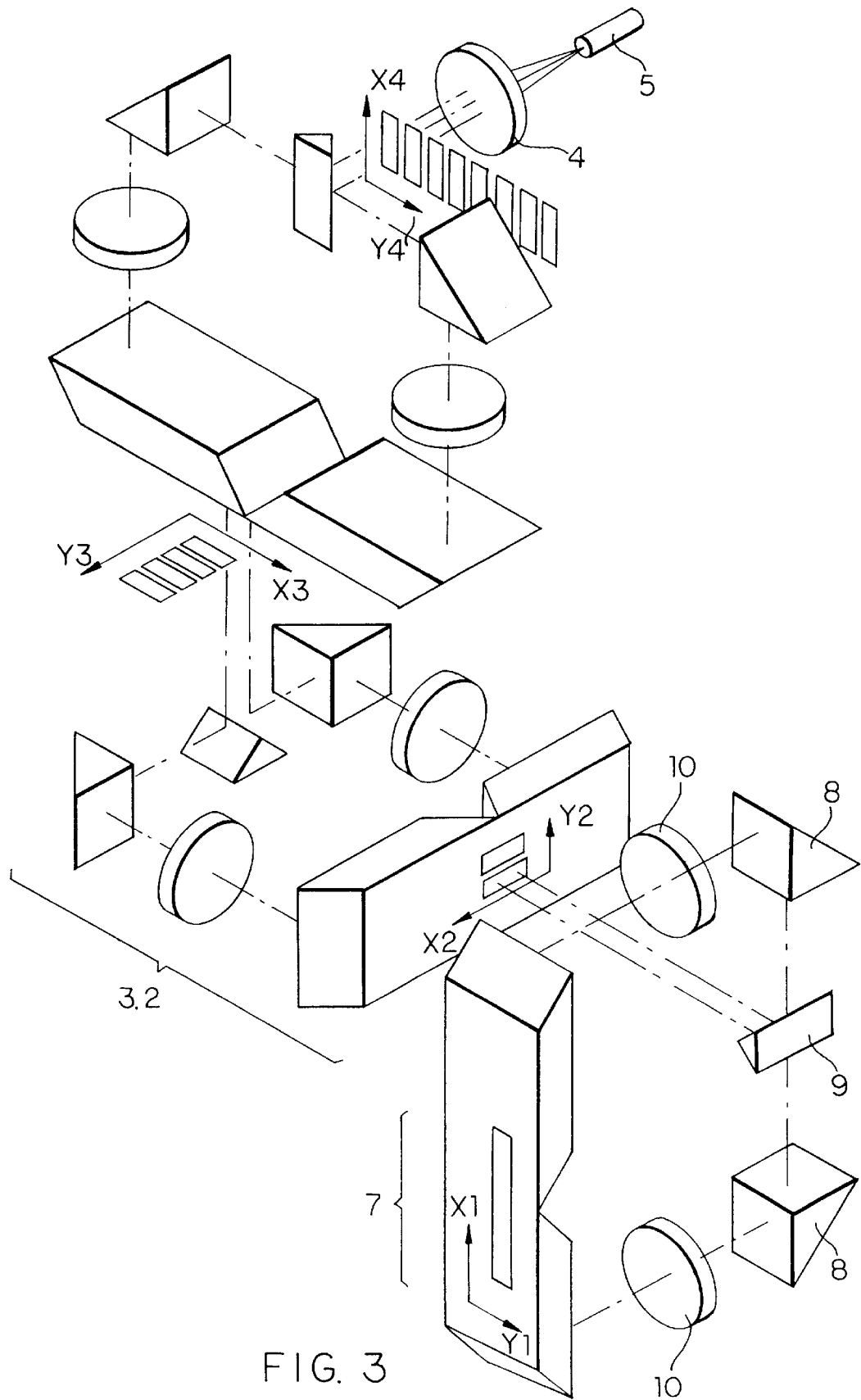
FIG. 3 is a schematic view showing a second embodiment example with three modules 3.2 as recombining unit 3.

The second embodiment example shown in FIG. 3 differs from the first embodiment example described above only with respect to the construction of the recombining unit 3 which, in this instance, is formed by three modules 3.1. While the radiation is divided into N partial beam bundles by an integrated optical element 3.1 with N rectangular rod pairs, as is described in the first embodiment example, the radiation is divided into two partial beam bundles by a module 3.2 according to the second embodiment example and into $2^M$ partial beam bundles when using M modules.

Since the laser diode lines, collimator units 2 and combining units 3 arranged upstream of the first module 3.2 are identical to those of the first embodiment example in quantity, arrangement and construction, they are not shown in the figure.

The individual modules 3.2 are identically constructed and divide and deflect the respective impinging radiation in an identical way. Each is formed of a pair of rhomboid prisms 7 which divides the impinging radiation into two partial beam bundles, two half-prisms 8, and a prism 9 which deflect the partial beam bundles and recombine them. As will be seen from the illustrated transformed coordinate system, the extent of the radiation in the x-direction is halved by each module, while the extent in the y-direction is comparatively slightly increased as determined by the relative position of the prism 9 with respect to the half-prisms 8. An additional effect in contrast to the first embodiment example is achieved by the arrangement of a lens 10 in front of the half-prisms 8. The lens 10 is so arranged and dimensioned that the focal planes of the lenses 10 arranged one behind the other in the optical beam path coincide and accordingly form lens waveguides. This offers the additional advantage over the first embodiment example that the light fields transmitted from one focal plane to the next focal plane are connected by a spatial Fourier transform and an angle-correct unification of the total radiation is also accordingly effected.

| Reference numbers: | |
|---|---|
| 1 | collimator unit |
| 2 | combining unit |
| 3 | recombining unit |
| 3.1 | integrated optical element |
| 3.2 | module |
| 4 | collecting optics |
| 5 | light-conducting fiber |
| 6 | individual cylindrical lens |
| 7 | rhomboid prism pair |
| 8 | half-prism |
| 9 | prism |
| 10 | lens |

We claim:

1. An arrangement for combining and shaping the radiation of a plurality of laser diode lines comprising:

at least two laser diode lines whose radiation has a cross section in the emission plane (x-y plane) whose longitudinal axis is a multiple of the transverse axis;

one collimator unit for each laser diode line, which collimator unit is arranged downstream thereof in the radiation;

a combination unit for combining the collimated radiation of the individual laser diode lines by means of a side-by-side arrangement in the direction of the transverse; and a recombining unit for dividing the combined radiation in the direction of the longitudinal axes into individual partial beams and recombining the latter by means of a side-by-side arrangement in the direction of the transverse axes.

2. The arrangement according to claim 1, wherein collecting optics are additionally provided and are arranged downstream of the recombining unit and couple the radiation into an optical element, arranged downstream.

3. The arrangement according to claim 1, wherein the collimator unit is formed of an individual cylindrical lens which collimates the radiation of the laser diode line in the direction of the transverse axis.

4. The arrangement according to claim 3, wherein the collimator unit additionally comprises a cylindrical lens line which collimates the radiation of the laser diode line in the direction of the longitudinal axis.

5. The arrangement according to claim 3, wherein the cylindrical lenses have an aspherical profile to eliminate spherical aberrations.

6. The arrangement according to claim 3, wherein the cylindrical lenses are gradient index lenses.

7. The arrangement according to claim 1, wherein the combining unit is constructed as an integrated optical element and comprises plates with transparent and reflecting facets.

8. The arrangement according to claim 1, wherein the recombining unit is an integrated optical element which is formed of at least four rectangular rods of at least two different lengths, each with a 45-degree facet, which rectangular rods form two stacks in order of decreasing length, and every two rectangular rods of different stacks form a pair of rods with the same optical path length and are so arranged relative to one another that the radiation impinging on the 45-degree facet of the first of the two rectangular rods in the direction of its axis is reflected to the 45-degree facet of the second of the two rectangular rods and exits the latter in the direction of its axis, and the quantity of rod pairs determines the quantity of occurring partial beams.

9. The arrangement according to claim 1, wherein the recombining unit is formed of at least one module which includes, in the radiation direction, one rhomboid prism pair 7 for dividing the beams into two partial beams, two half-prisms 8, and a prism 9.

10. The arrangement according to claim 9, wherein the recombining unit is formed of M modules which are arranged one behind the other in the radiation direction and thus form $2^M$ partial beams.

11. The arrangement according to claim 10, wherein a lens is arranged in front of each half-prism and the focal planes of the lenses of adjacent modules coincide and accordingly form a lens waveguide.

* * * * *